(12) United States Patent  
Kirchner et al.

(10) Patent No.: US 9,231,141 B2
(45) Date of Patent: Jan. 5, 2016

(54) CONTROLLING A SOLAR TRACKING SYSTEM

(71) Applicant: International Business Machines Corporation, Armonk, NY (US)

(72) Inventors: Peter D. Kirchner, Putnam Valley, NY (US); Dennis F. Manzer, Bedford Hills, NY (US); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 13/715,403

(22) Filed: Dec. 14, 2012

(65) Prior Publication Data

US 2014/0166069 A1    Jun. 19, 2014

(51) Int. Cl.
*G01P 3/42* (2006.01)
*H01L 31/052* (2014.01)
*F24J 2/38* (2014.01)

(52) U.S. Cl.
CPC .............. *H01L 31/0522* (2013.01); *F24J 2/38* (2013.01); *H02S 20/32* (2014.12); *Y02E 10/40* (2013.01); *Y02E 10/50* (2013.01)

(58) Field of Classification Search
CPC .............. G01P 3/42; G01P 3/44; G01P 3/66; G01P 15/003; G01P 2015/0862; F24J 2/38; F24J 2/40; F24J 2/407; F24J 2/54; F24J 2/5417; F24J 2/5431; F24J 2002/0416
USPC ............ 126/573–582, 601–608; 33/318–324; 250/203.4; 136/246
See application file for complete search history.

(56) References Cited

U.S. PATENT DOCUMENTS

| | | | |
|---|---|---|---|
| 3,840,726 A * | 10/1974 | Harrison | 701/300 |
| 6,454,036 B1 * | 9/2002 | Airey et al. | 180/167 |
| 2005/0068228 A1 * | 3/2005 | Burchfiel | 342/357.06 |
| 2008/0011288 A1 | 1/2008 | Olsson | |
| 2011/0030762 A1 | 2/2011 | Kim | |
| 2011/0114079 A1 | 5/2011 | Heckendorn | |
| 2011/0297141 A1 | 12/2011 | Correia et al. | |
| 2012/0075109 A1 * | 3/2012 | Wang et al. | 340/686.1 |

(Continued)

FOREIGN PATENT DOCUMENTS

WO    2009091339 A2    7/2009

OTHER PUBLICATIONS

PCT International Search Report and Written Opinion; International Application No. PCT/US2013/065353; International Filing Date: Oct. 17, 2013; Date of Mailing: Mar. 11, 2014; pp. 1-11.

(Continued)

*Primary Examiner* — Avinash Savani
(74) *Attorney, Agent, or Firm* — Cantor Colburn LLP; Vazken Alexanian

(57) ABSTRACT

A method of tracking the sun is disclosed. A measurement of a gravity vector is obtained in a frame of reference of a solar collector rotatable with respect to an earth center of reference. A measurement of a magnetic direction vector is obtained in the frame of reference of the solar collector. The orientation of the solar collector is determined from the obtained measurement of the gravity vector and the obtained measurement of the magnetic direction. The orientation of the solar collector is altered in order to track the sun.

30 Claims, 5 Drawing Sheets

(56) References Cited

U.S. PATENT DOCUMENTS

2012/0123720 A1    5/2012   Fukuba et al.
2012/0279485 A1   11/2012   Koningstein

OTHER PUBLICATIONS

Aichi Steel Corporation, et al., "AMI602—G-Square G2 Motion Sensor," www.aichi-mi.com/3_products/catalog%20e.pdf; Dec. 8, 2000; pp. 1-12.

* cited by examiner

CONTROLLING A SOLAR TRACKING SYSTEM

BACKGROUND

The present disclosure relates to solar energy, and more specifically, to a method of tracking the sun with a solar collector.

A solar tracking system typically includes a moving planar structure on which photovoltaic modules are mounted, a drive system to move the structure, a control system, and a base structure for mounting the tracking system to the ground or suitable support structure. The tracking system is designed to point or direct the photovoltaic modules on the moving planar structure towards the sun. Optical sensors, for example, are often used to track the sun when the sun is visible. Though accurate, these sensors are not effective in tracking the sun's location during periods in which the sun is obscured (e.g. by cloud cover). Once the sun reappears, time is then generally lost while the sensor slews the photovoltaic modules back towards the location of the sun's reappearance. In concentrating photovoltaic systems, this lost time amounts to power loss.

SUMMARY

According to one embodiment of the present disclosure, a method of tracking the sun includes: obtaining a measurement of a gravity vector in a frame of reference of a solar collector rotatable with respect to an earth center of reference; obtaining a measurement of a magnetic direction vector in the frame of reference of the solar collector; determining an orientation of the solar collector from the obtained measurement of the gravity vector and the obtained measurement of the magnetic direction vector; and altering the determined orientation of the solar collector to track the sun.

According to another embodiment of the present disclosure, a method of orienting a device includes: obtaining a measurement of a gravity vector in a frame of reference of the device; obtaining a measurement of a magnetic direction vector in the frame of reference of the device; determining an orientation of the device with respect to the earth-centered frame of reference using the obtained measurement of the gravity vector and the obtained measurement of the magnetic direction vector; and orienting the device using the determined orientation of the device and a selected parameter.

According to another embodiment of the present disclosure, a method of determining an orientation of a solar collector includes: determining a gravity vector in a frame of reference of the solar collector; determining a magnetic direction vector in the frame of reference of the solar collector; determining an earth-centered coordinate system using the determined gravity vector and the determined magnetic direction vector; and determining one or more angles between axes of the solar collector frame of reference and the earth-centered coordinate system to determine the orientation of the solar collector.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Figure 1:
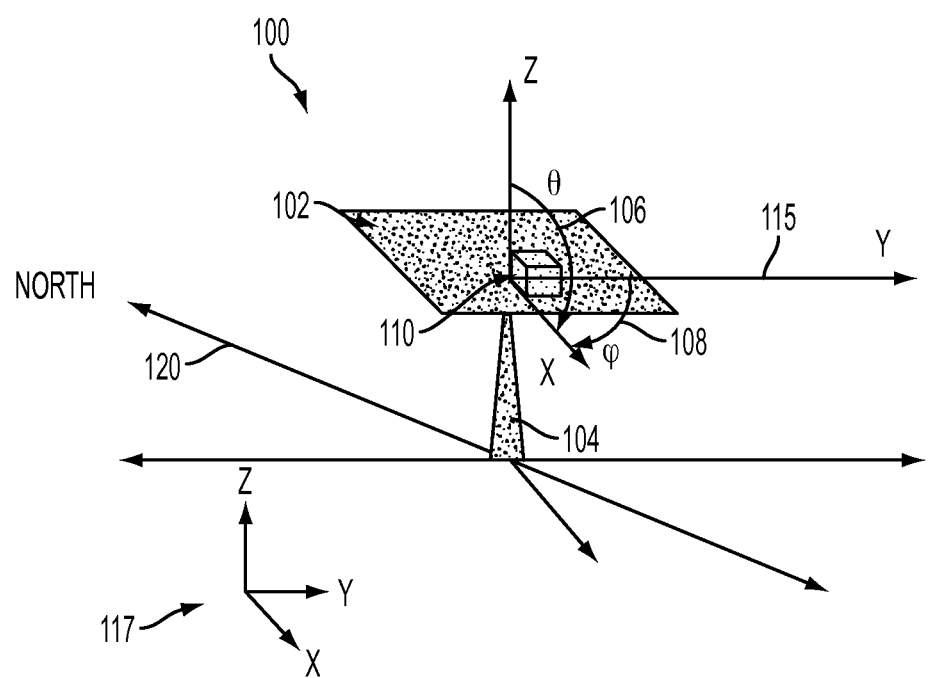
FIG. 1 shows a tracking device suitable for tracking a celestial object such as the sun in an exemplary embodiment of the present disclosure.

FIG. 1 shows a tracking device 100 suitable for tracking a celestial object such as the sun in an exemplary embodiment of the present disclosure. The exemplary tracking device 100 includes a solar collector 102 rotatably coupled to a mount 104. The mount 104 is fixedly coupled to the earth. The earth defines an earth-centered frame of reference indicated by the (X, Y, Z) coordinate system 117. The solar collector 102 defines a solar collector frame of reference indicated by the (x, y, z) coordinate system 115. In various embodiments, the Z-axis of the earth-centered frame of reference is directed normal to a surface of the earth (i.e., along a radial line of the earth) and the z-axis of the solar collector frame of reference is directed normal to a surface of the solar collector 102. Rotation of the solar collector 102 relative to the earth therefore rotates the solar collector frame of reference (i.e., (x, y, z) coordinate system 115) with respect to the earth-centered frame of reference (i.e., (X, Y, Z) coordinate system 117). An orientation sensor 110 is coupled to the solar collector 102. The orientation sensor 110 is fixed within the (x, y, z) frame of reference 115 of the solar collector 102 and therefore rotates with the solar collector 102. The orientation sensor 110 may be used to determine an orientation of the solar collector 102 with respect to the earth frame of reference 117 using methods disclosed herein. The location of the sun relative to the earth is determined by using the known position of the sun versus time, the current time of day, and the geographic location on the earth. The determined orientation difference between the true position of the sun and the computed orientation of the solar collector may then be used to guide the tracking system drive mechanism to alter an orientation of the solar collector 102 using methods disclosed herein. The solar collector 102 may include additional tracking devices such as an optical sensor (not shown) that may orient the solar collector 102 towards the sun when the sun is visible. The orientation sensor 110 may therefore be used to supplement the optical sensor in situations where the sun is no longer visible, such as when a cloud passes between the sun and the optical sensor. The tracking system disclosed herein directs the orientation of the solar collector 102 along a path that approximates the motion of the sun along the sky. Thus, when the sun reappears from behind the cloud, the time that it takes for the optical sensors to lock on to the sun may be reduced.

The solar collector 102 may rotate through at least an elevation angle θ 106 and an azimuth angle φ 108. In one embodiment, the elevation angle θ 106 may refer to an angle of the z-axis of the solar collector 102 measured relative to the Z-axis of the earth. The azimuth angle φ 108 may refer to a rotation angle of the solar collector 102 about the Z-axis. An orientation for θ=0 and φ=0 may be selected by the user. In an exemplary embodiment, elevation angle θ may be measured relative to a vertical direction, i.e., the Z-axis of the earth-centered coordinate system 117. In another embodiment, azimuth angle φ may be measured with respect to compass point North 120. Other suitable selections for θ=0 and φ=0 may be used. In alternate embodiments, the methods disclosed herein may be used with other suitable coordinate systems.

Figure 2:
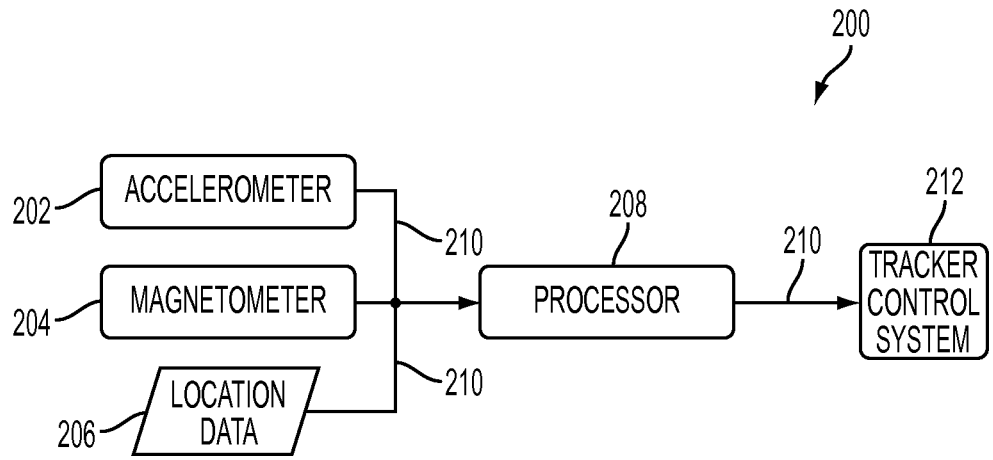
FIG. 2 shows an exemplary orientation system for tracking the sun in an exemplary embodiment.

FIG. 2 shows an exemplary orientation system 200 for tracking the sun. The system includes an accelerometer 202 and a magnetometer 204. In one embodiment, the accelerometer 202 and the magnetometer 204 are components of the orientation sensor 110. The accelerometer 202 and the magnetometer 204 are coupled to the solar collector 102 and rotate with the solar collector 102. The accelerometer 202 is configured to obtain gravity measurements along three orthogonal axes and thereby to determine a gravity vector as seen in the frame of reference 115 of the solar collector 102. The gravity vector is directed along a radial line of the earth such as a line substantially perpendicular to the surface of the earth, for example. As the solar collector 102 rotates with respect to the earth, the measurement of the gravity vector changes. Therefore, the obtained measurement of the gravity vector may be used to determine an orientation of the solar collector 102 with respect to the earth centered frame of reference. The accelerometer 202 may be any accelerometer for obtaining accelerometer measurements along three orthogonally-oriented directions axes such as the (x, y, z) axes of the coordinate system 115. In various embodiments, the accelerometer 202 may include three-orthogonally-oriented single-axis accelerometer sensors, two orthogonally-mounted two-axis accelerometer sensors, or a single three-axis accelerometer sensor.

The magnetometer 204 is configured to obtain magnetic measurements related to a magnetic field of the earth as seen in the reference frame of the solar collector 102. The magnetometer 204 may obtain a magnetic measurement along three orthogonal axes such as the (x, y, z) axes of the coordinate system 115. The magnetometer 204 thereby determines a direction of magnetic North as seen in the frame of reference of the solar collector 102. As the magnetometer 204 moves with the solar collector 102, the determined magnetic direction may change. Thus, the magnetometer measurements may be used to determine an orientation of the solar collector 102 with respect to a magnetic field of the earth. In various embodiments, the magnetometer 204 may include three single-axis magnetometers sensors that are orthogonally oriented, two two-axis magnetometers that are orthogonally mounted, or a single three-axis magnetometer sensor.

Signals from the accelerometer 202 and the magnetometer 204 may be sent to a processor 208 over a suitable communication link 210. An exemplary communication link may utilize communication link technologies that include, but are not limited to, I2C bus, RS232, RS488, ZIGBEE wireless, communication, BLUETOOTH wireless communication and Ethernet. In an exemplary embodiment, I2C couples magnetometer and accelerometer to the processor 208. In one embodiment, the processor 208 may be affixed to the rotatable solar collector 102. Alternately, the processor 208 may be affixed to mount 104, located near the tracking device 100 or at a location away from the tracking device 100. The processor 208 is configured to perform calculations disclosed herein for determining an orientation of the solar collector 102 using measurements obtained from the accelerometer 202 and the magnetometer 204. The processor 208 is further configured to use the determined orientation of the solar collector 102 to track the sun or other celestial object.

Location data 206 indicative of a location of the solar collector 102 may also be sent to the processor 208. The processor 208 may perform a calculation using the magnetometer measurements, the accelerometer measurements and the location of the solar collector 102 to determine an orientation of the solar collector 102. The processor 208 may send orientation data to a tracker control system 212 over a communication link 210 that may use any of the exemplary communication link technologies disclosed herein. The tracker control system 212 may change an orientation path of the solar collector 102 according to the orientation data received from the processor 208. The tracker control system 212 may include a device for changing an orientation of the solar collector 102 and specifically to change at least one of the azimuthal angle φ and the elevation angle θ in order to track the sun. In an exemplary embodiment, the tracker control system 212 includes an azimuthal drive that rotates the solar collector 102 through an azimuth angle φ and an elevation drive that rotates the solar collector through the elevation angle θ.

Figure 3:
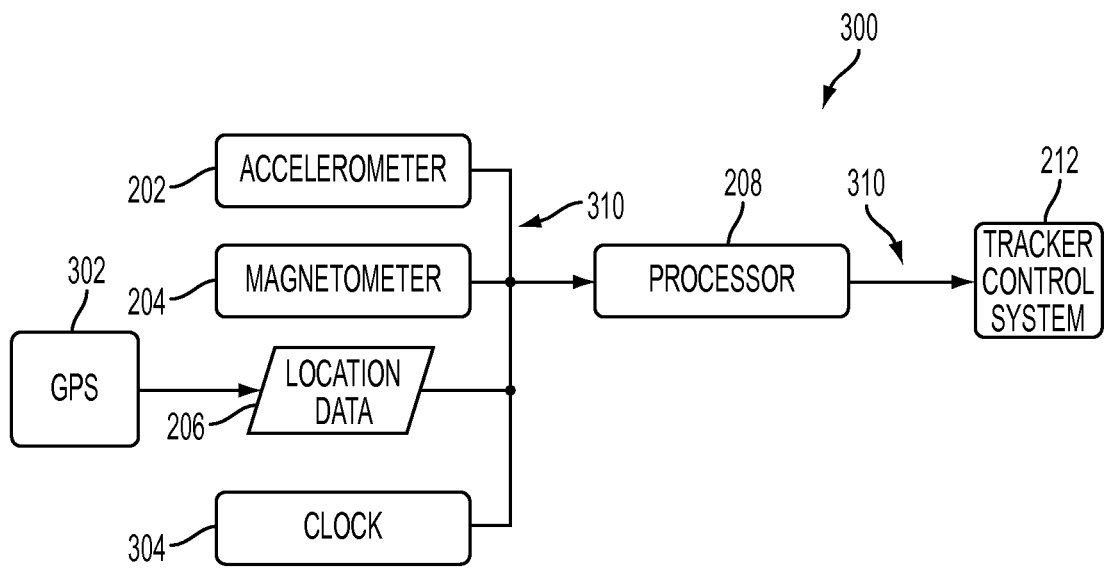
FIG. 3 shows an alternative embodiment of an orientation system for tracking the sun.

FIG. 3 shows an alternative embodiment of an orientation system 300 for tracking a celestial object such as the sun. The alternative orientation system 300 includes accelerometer 202 for determining a gravity vector in the frame of reference of the solar collector 102 and magnetometer 204 for determining a magnetic direction vector in the frame of reference of the solar collector 102. A location tracking unit 302 such as a Global Positioning Satellite (GPS) location device may provide location data 206 indicative of the location of the solar collector 102. In one embodiment, the location tracking unit 302 continuously monitors the location of the solar collector 102. While a solar collector is generally stationary, continuous monitoring of the location may be used for a solar collector that is at a non-static location or is in motion with respect to the earth coordinate system. In another embodiment, the location tracking unit 302 determines the location data 206 once and the processor 208 stores the location data at a suitable memory location for use in later calculations. A clock 304 provides a current time to the processor 208. In an exemplary embodiment, the current time includes year, month, date, hour, minute and second. The clock 304 may be a clock giving local time or universal time or may be any timing mechanism that provided a time value that is suitable for performing the orientation of the solar collector according to the methods disclosed herein. The processor 208 may use a determined orientation of the solar collector 102 and the time provided by clock 304 to determine a rotation necessary to maintain tracking of the sun as the sun moves across the sky. The tracker control system 212 may use the time to move the oriented solar collector 102 to a new orientation based on current orientation, location and time data, thereby tracking the sun based on an estimated movement of the sun across the sky over time.

The accelerometer 202, magnetometer 204, GPS location device 302 and clock 304 may communicate their respective data to processor 208 over a communication link 310 that may use any of the exemplary communication link technologies discloses herein. A similar communication link 310 is provided between the processor 208 and the tracker control system 212.

Figure 4:
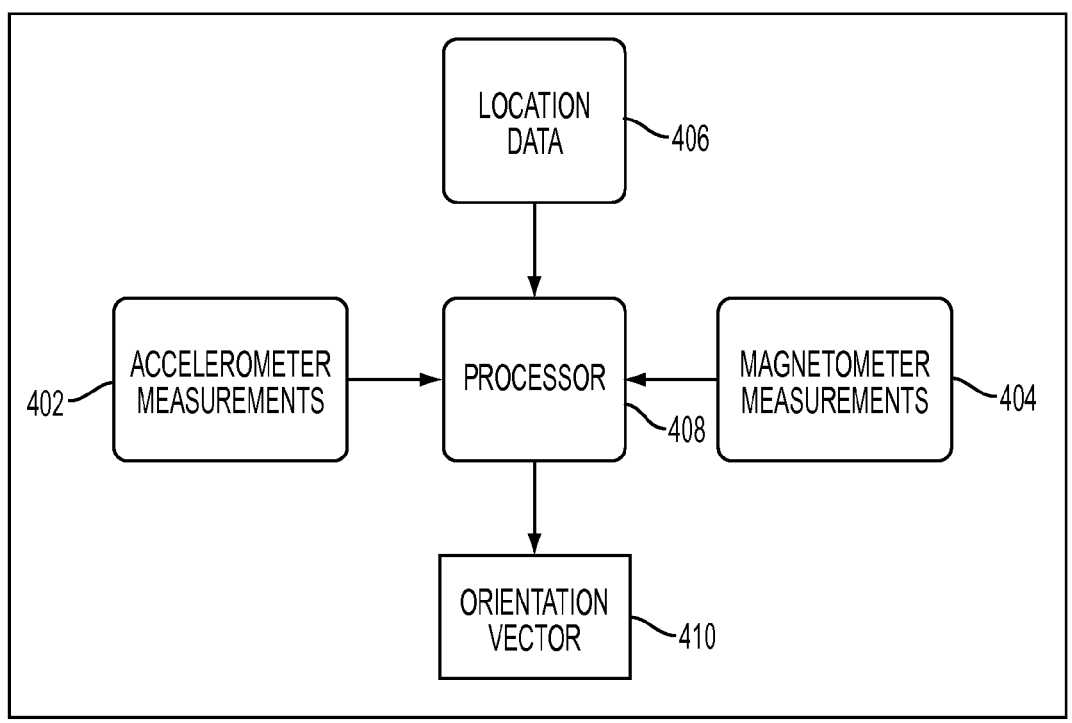
FIG. 4 shows an exemplary schematic illustration for determining an orientation of a solar collector.

FIG. 4 shows an exemplary schematic illustration for determining an orientation of the solar collector 102. Accelerometer measurements 402 from exemplary accelerometer 202, magnetometer measurements 404 from exemplary magnetometer 204 and location data 406 are obtained and sent to processor 408. The processor determines an orientation of the solar collector 102 with respect to the earth using exemplary methods disclosed herein. The processor 408 may further use the determined orientation of the solar collector 102 to re-orient the solar collector 102 towards a selected celestial object, such as the sun. In other calculations, the location data of the solar collector 102 may be used to calibrate magnetic north (i.e., the determined magnetic vector) to a geographic north.

Figure 5:
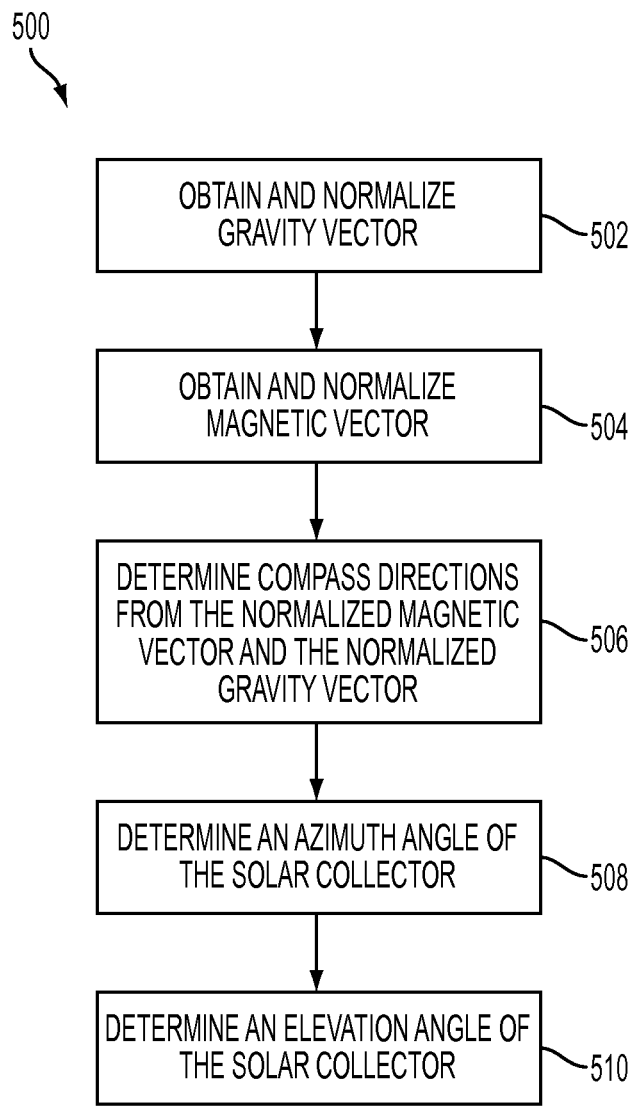
FIG. 5 shows a flowchart illustrating an exemplary method of determining an orientation of the solar collector.
Figure 6:
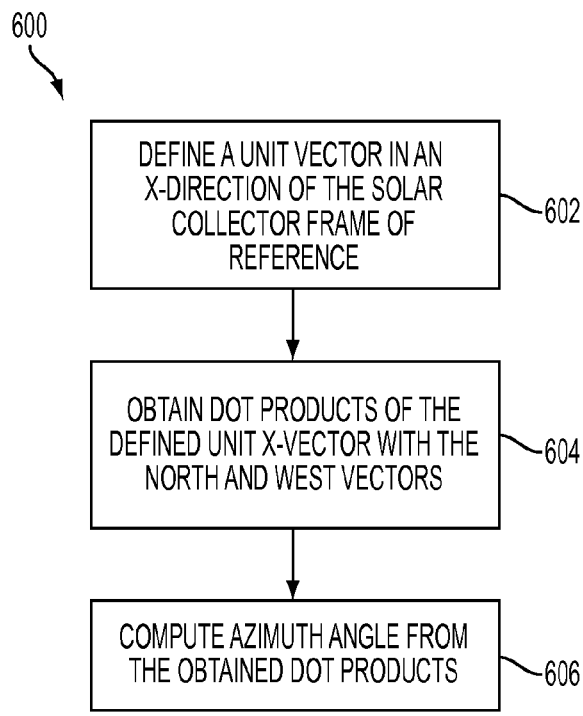
FIG. 6 shows a flowchart illustrating a method for determining an azimuth angle of the solar collector in an exemplary embodiment.

FIG. 5 shows a flowchart 500 illustrating an exemplary method of determining an orientation of the solar collector 102. In block 502, a gravity vector is obtained using the exemplary accelerometer 202. The gravity vector is then normalized. In block 504, a magnetic direction vector is obtained using the exemplary magnetometer 204. The magnetic direction vector is then normalized. In block 506, compass direction vectors are determined from the normalized gravity vector and the normalized magnetic direction vector. For example, a compass direction vector for West may be determined by performing a cross product of the normalized magnetic direction vector and the gravity vector according to Equation (1):

$$\hat{w} = \hat{m} \times \hat{g} \qquad \text{Eq. (1)}$$

wherein $\hat{g}$ is a normalized gravity vector, $\hat{m}$ is a normalized magnetic direction vector and $\hat{w}$ is a normalized vector pointing along a compass direction for West. Similarly, a compass direction vector for East may be determined by performing a cross product of the normalized magnetic direction vector rand the gravity vector according to Equation (2):

$$\hat{e} = \hat{m} \times \hat{g} \qquad \text{Eq. (2)}$$

wherein $\hat{e}$ is a normalized vector pointing along a compass direction for East. A compass direction vector for North may be determined by performing a cross product of the normalized gravity vector and the normalized "West" vector (from Eq. (1)) according to Equation (3):

$$\hat{n} = \hat{g} \times \hat{w} \qquad \text{Eq. (2)}$$

wherein $\hat{n}$ is a normalized vector pointing along a compass direction for North. Thus, box 506 determines vectors sufficient for defining an earth frame of reference, using for example, $\hat{n}$, $\hat{w}$ and $\hat{g}$. In block 508, an azimuth $\phi$ of the solar collector 102 is determined. Details of box 508 are shown in the flowchart of FIG. 6. In block 510, an elevation angle $\theta$ of the solar collector 102 is determined. Details of block 510 are shown in the flowchart of FIG. 6.

FIG. 6 shows a flowchart 600 illustrating a method for determining an azimuth angle $\phi$ of the solar collector 102 in an exemplary embodiment. In block 602, a unit azimuth vector is defined along an x-direction of the frame of reference (i.e., the (x, y, z) coordination system) of the solar collector 102. In box 604, dot products are obtained to determine a projection of the unit azimuth vector along the axes of the Earth frame of reference, as shown in Eqs. (4):

$$\overline{\phi}_X = \hat{x} \times \hat{n}; \ \overline{\phi}_Y = \hat{x} \times \hat{e}; \ \overline{\phi}_Z = 0 \qquad \text{Eq. (4)}$$

where $\hat{x}$ is the unit azimuth vector of the solar collector, $\overline{\phi}_X$ is a component of the azimuth vector along the compass point East and $\overline{\phi}_Y$ is a component of the azimuth vector along the compass point North. Angle $\overline{\phi}_Z$ is a component of the azimuth along the Z-direction of the earth frame of reference and is zero by definition. In block 606, the azimuth angle is determined from the dot products obtained in block 604 using standard calculations.

Figure 7:
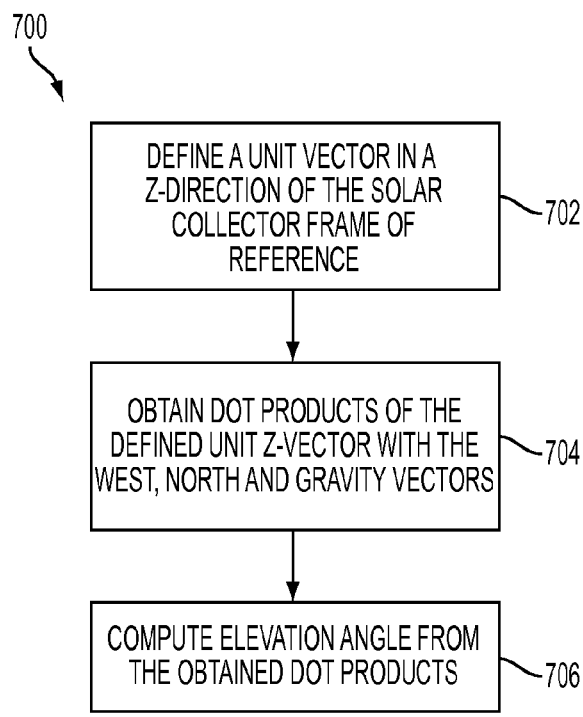
FIG. 7 shows a flowchart illustrating a method of determining an elevation angle of the solar collector in an exemplary embodiment.

FIG. 7 shows a flowchart 700 illustrating a method of determining an elevation angle $\theta$ of the solar collector 102 in an exemplary embodiment. In block 702, an elevation angle unit vector is defined along a z-direction of the frame of reference of the solar collector. In block 704, dot products are obtained to determine a projection of the unit elevation angle unit vector along the axes of the Earth frame of reference, as shown in Eqs. (5)

$$\overline{\phi}_X = \hat{z} \times \hat{w}; \ \overline{\phi}_Y = \hat{z} \times \hat{n}; \ \overline{\phi}_Z = \hat{z} \times \hat{g} \qquad \text{Eq. (5)}$$

where $\hat{z}$ is the unit elevation vector of the solar collector, $\overline{\phi}_X$ is a component of the elevation vector along the compass point West, $\overline{\phi}_Y$ is a component of the unit elevation vector along the compass point North and $\overline{\phi}_Z$ is a component of the unit elevation vector along the determined unit gravity vector. In block 706, the elevation angle is determined from the dot products obtained in block 704 using standard calculations.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

While the exemplary embodiment to the disclosure had been described, it will be understood that those skilled in the art, both now and in the future, may make various improvements and enhancements which fall within the scope of the claims which follow. These claims should be construed to maintain the proper protection for the disclosure first described.

What is claimed is:

1. A method of tracking the sun, comprising:
using an accelerometer to obtain a measurement of a gravity vector in a frame of reference of a solar collector rotatable with respect to an earth center of reference;
using a magnetometer to obtain a measurement of a magnetic direction vector in the frame of reference of the solar collector;
calculating components of an earth-centered frame of reference using the obtained measurement of the gravity vector and the obtained measurement of the magnetic direction vector;
calculating an orientation of a vector of the solar collector relative to the components of the earth-centered frame of reference;
using a clock to determine a rotation necessary to maintain tracking of the sun as the sun moves across the sky; and
altering the orientation of the solar collector to track the sun using the determined rotation.

2. The method of claim 1, further comprising determining a location of the solar collector and tracking the sun using the determined orientation of the solar collector, the determined time and the determined location of the solar collector.

3. The method of claim 1, further comprising determining a location of the sun using at least one of a lookup table and a formula.

4. The method of claim 1, further comprising wherein determining the earth-centered coordinate system further comprises determining a compass direction vector for West using a cross product of the obtained magnetic direction vector and the gravity vector and determining a compass direction for North using a cross product of the gravity vector and the compass direction vector for West.

5. The method of claim 4, further comprising using the location of the solar collector to calibrate magnetic north to a geographic north.

6. The method of claim 1, further comprising obtaining the measurement of the gravity vector using an accelerometer coupled to the solar collector and obtaining the measurement of the magnetic direction using a magnetometer coupled to the solar collector.

7. The method of claim 6 wherein the accelerometer further comprises at least one of: three orthogonally-oriented single-axis accelerometers; two orthogonally-mounted 2-axis accelerometers; and a single 3-axis accelerometer.

8. The method of claim 6 wherein the magnetometer further comprises at least one of: three orthogonally-oriented single-axis magnetometers; two orthogonally-mounted 2-axis magnetometers; and a single 3-axis magnetometer.

9. The method of claim 1 further comprising reducing a search time for finding the sun for a sensor of the tracking device.

10. A method of orienting a solar collector, comprising:
using an accelerometer to obtain a measurement of a gravity vector in a frame of reference of the solar collector;
using a magnetometer to obtain a measurement of a magnetic direction vector in the frame of reference of the solar collector;
calculating components of an earth-centered frame of reference using the obtained measurement of the gravity vector and the obtained measurement of the magnetic direction vector;
calculating an orientation of a vector of the solar collector with respect to the components of the earth-centered frame of reference;
using a clock to determine a rotation of the solar collector that maintains the orientation of the vector towards the sun as the sun moves across the sky; and
orienting the solar collector using the determined rotation.

11. The method of claim 10, further comprising determining the rotation using the clock and a location of the solar collector.

12. The method of claim 10 further comprising determining a location of the sun using at least one of a lookup table and a formula.

13. The method of claim 10, further comprising obtaining the measurement of the gravity vector using an accelerometer coupled to the device and obtaining the measurement of the magnetic direction using a magnetometer coupled to the device.

14. The method of claim 13 wherein the accelerometer further comprises at least one of: three orthogonally-oriented single-axis accelerometers; two orthogonally-mounted 2-axis accelerometers; and a single 3-axis accelerometer.

15. The method of claim 13 wherein the magnetometer further comprises at least one of: three orthogonally-oriented single-axis magnetometers; two orthogonally-mounted 2-axis magnetometers; and a single 3-axis magnetometer.

16. An apparatus for tracking the sun, comprising:
a solar collector rotatable with respect to an earth frame of reference;
an accelerometer rotatable with the solar collector, the accelerometer configured to measure a gravity vector;
a magnetometer rotatable with the solar collector, the magnetometer configured to measure a magnetic direction vector; and
a processor configured to:
calculate components of an earth-centered frame of reference using the gravity vector and the magnetic direction vector,
calculate an orientation of the solar collector relative to the components of the earth-centered frame of reference from the measured gravity vector and the measured magnetic direction vector,
use a clock to determine a rotation that maintains tracking of the sun as the sun moves across the sky, and
alter the orientation of the solar collector to track the sun using the determined rotation.

17. The apparatus of claim 16, wherein the processor is further configured to obtain a location of the solar collector and track the sun using the determined orientation of the solar collector, the determined time and the determined location of the solar collector.

18. The apparatus of claim 16, wherein the processor is further configured to determine a location of the sun using at least one of a lookup table and a formula.

19. The apparatus of claim 16, wherein the processor is further configured to determine an earth-centered coordinate system using the obtained gravity vector and the obtained magnetic direction vector.

20. The apparatus of claim 19, wherein the processor is further configured to calibrate a determined magnetic north to a geographic north.

21. The apparatus of claim 16 wherein the accelerometer further comprises at least one of: three orthogonally-oriented single-axis accelerometers; two orthogonally-mounted 2-axis accelerometers; and a single 3-axis accelerometer.

22. The apparatus of claim 16 wherein the magnetometer further comprises at least one of: three orthogonally-oriented single-axis magnetometers; two orthogonally-mounted 2-axis magnetometers; and a single 3-axis magnetometer.

23. The apparatus of claim 16, further comprising a positioning device for determining the location of the solar collector.

24. The apparatus of claim 16, further comprising a sensor for tracking the sun, wherein the processor is further configured to orient the solar collector to reduce an amount of time for the sensor to locate the sun.

25. An apparatus for orienting a solar collector, comprising:
- an accelerometer configured to measure a gravity vector in a frame of reference of the solar collector;
- a magnetometer configured to measure a magnetic direction vector in the frame of reference of the solar collector; and
- a processor configured to:
  - calculate components of an earth-centered frame of reference using the gravity vector and the magnetic direction vector,
  - calculate an orientation of the solar collector with respect to the components of the earth-centered frame of reference using the obtained gravity vector and the magnetic direction vector,
  - use a clock to determine a rotation that maintains tracking of the sun as the sun moves across the sky, and orient the solar collector using the calculated orientation of the solar collector and the determined rotation.

26. The apparatus of claim 25, wherein the processor is further configured to determine the rotation using the clock and a location of the solar collector.

27. The apparatus of claim 26, wherein the processor is further configured to determine a location of the sun using at least one of a lookup table and a formula.

28. The apparatus of claim 25, wherein the processor is further configured to obtain the measurement of the gravity vector using an accelerometer coupled to the device and obtain the measurement of the magnetic direction vector using a magnetometer coupled to the device.

29. The apparatus of claim 28, wherein the accelerometer further comprises at least one of: three orthogonally-oriented single-axis accelerometers; two orthogonally-mounted 2-axis accelerometers; and a single 3-axis accelerometer.

30. The apparatus of claim 28, wherein the magnetometer further comprises at least one of: three orthogonally-oriented single-axis magnetometers; two orthogonally-mounted 2-axis magnetometers; and a single 3-axis magnetometer.

* * * * *